United States Patent

Bakowski et al.

[11] Patent Number: 5,909,039
[45] Date of Patent: *Jun. 1, 1999

[54] INSULATED GATE BIPOLAR TRANSISTOR HAVING A TRENCH

[75] Inventors: Mietek Bakowski, Skultuna; Christopher Harris, Sollentuna; Ulf Gustafsson, Linköping, all of Sweden

[73] Assignee: ABB Research Ltd., Zurich, Switzerland

[ * ] Notice: This patent is subject to a terminal disclaimer.

[21] Appl. No.: 08/783,579

[22] Filed: Jan. 13, 1997

Related U.S. Application Data

[63] Continuation-in-part of application No. 08/637,105, Apr. 24, 1996, Pat. No. 5,763,902.

[51] Int. Cl.⁶ .................................................. H01L 29/74
[52] U.S. Cl. ......................... 257/139; 257/144; 257/622; 257/77
[58] Field of Search .................................. 257/139, 144, 257/145, 622, 378, 153, 147, 77

[56] References Cited

U.S. PATENT DOCUMENTS

| | | | |
|---|---|---|---|
| 4,223,328 | 9/1980 | Terasawa et al. | 257/136 |
| 4,466,173 | 8/1984 | Baliga | 438/137 |
| 5,079,602 | 1/1992 | Harada | 257/341 |
| 5,173,435 | 12/1992 | Harada | 438/138 |
| 5,233,215 | 8/1993 | Baliga | 257/490 |
| 5,396,087 | 3/1995 | Baliga | 257/139 |
| 5,397,717 | 3/1995 | Davis et al. | 438/274 |
| 5,506,421 | 4/1996 | Palmour | 257/77 |

OTHER PUBLICATIONS

Baliga et al., Gate Turn–Off Capability of Depletion–Mode Thyristors, IEEE Electron Device Letters, vol. 10, No. 10, Oct. 1989, pp.464–466.

Nishizawa et al., A Low–Loss High–Speed Switching Device: The 2500–V 300–A Static Induction Thyristor, IEEE Transactions on Electron Devices, vol. ED–33, No. 4, Apr. 1986.

*Primary Examiner*—John Guay
*Attorney, Agent, or Firm*—Pollack, Vande Sande & Amernick

[57] ABSTRACT

An IGBT comprises a drain, a highly doped p-type substrate layer, a highly doped n-type buffer layer, a drift layer, a p-type base layer, a highly doped n-type source region layer and a source electrode. A trench is etched in the base layer and an insulating layer with a gate electrode thereon is arranged on the base layer from the source region layer to the drift layer for the creation of a conducting inversion channel there. A contact portion is provided vertically separated from the source region layer and has the source electrode applied thereon for collecting holes injected from the substrate layer to the drift layer at a vertical distance from the source region layer.

15 Claims, 2 Drawing Sheets

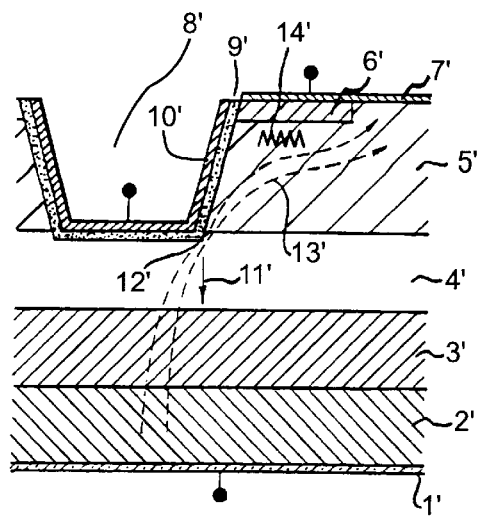
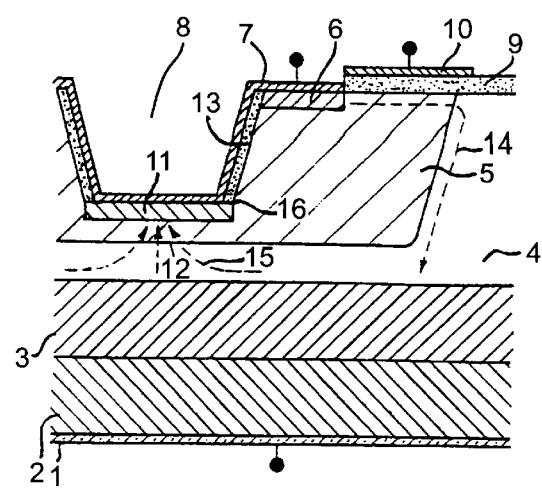
Fig. 1 PRIOR ART
Fig. 2
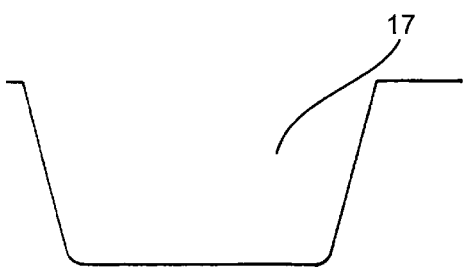
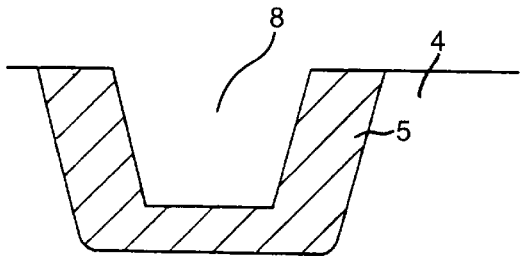
Fig. 3
Fig. 4
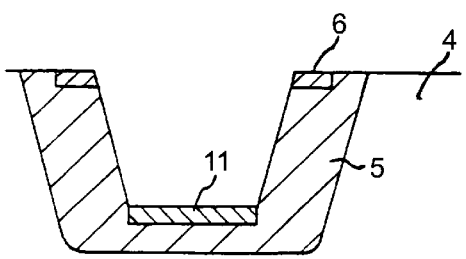
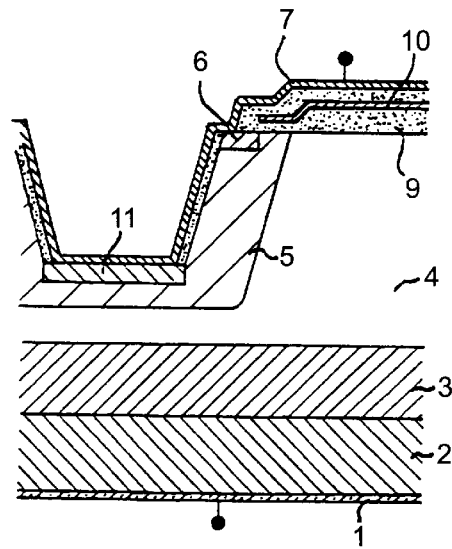
Fig. 5
Fig. 6

INSULATED GATE BIPOLAR TRANSISTOR HAVING A TRENCH

This is a continuation-in-part of application Ser. No. 08/637,105, filed Apr. 24, 1996, now U.S. Pat. No. 5,763,902.

TECHNICAL FIELD

The present invention relates to an insulated gate bipolar transistor (IGBT) comprising superimposed: a drain; a highly doped p-type substrate layer, one of a) a highly doped n-type buffer layer and b) no such layer; a low doped n-type drift layer; a p-type base layer; a highly doped n-type source region layer; and a source. The transistor further comprises a trench etched into the base layer; an insulating layer with a gate electrode thereon arranged on the base layer at least from the source region layer to the drift layer for, upon applying a voltage to the gate electrode, forming a conducting inversion channel in the base layer at the interface to the insulating layer for electron transport from the source to the drain, as well as a method for producing such a transistor.

BACKGROUND ART

Such IGBTs may especially be used as switching devices in power applications where they are very advantageous since they combine the preferred characteristic of bipolar junction transistor and MOSFETs, namely low conduction losses in the on-state, especially in devices with larger blocking voltages, and the possibility to be quickly turned on and off. These excellent switching properties of the IGBTs have in the past years resulted in a replacement of other semiconductor switching devices by IGBTs in many applications, but a significant research has been carried out for optimizing the function of these devices since they have in spite of the characteristics previously mentioned some not neglectible drawbacks.

This type of semiconductor device is particularly well suited for high power applications, and the invention is therefore especially occupied with the problem of providing an IGBT having SiC as semiconductor material, since it would then be possible to benefit from the superior properties of SiC in comparison with, especially Si; namely the capability of SiC to function well under extreme conditions. SiC has a high thermal stability due to its large bandgap energy, such devices fabricated from the material are able to operate at high temperatures, namely up to 1000° K. Furthermore, it has a high thermal conductivity, so that SiC devices may be arranged with a high density. SiC also has a more than five times higher breakdown field than Si so that it is well suited as a material in high power devices operating under conditions where high voltages may occur in the blocking state of a device. An IGBT made of this material has particularly low conduction losses in the on-state compared to a MOSFET. However, it is emphasized that the invention is not in any way restricted to this choice of semiconductor material, but any semiconductor material, such as Si, is conceivable.

Furthermore, such a trench does not have to be as deep as in normally so called trench IGBTs, but it may be considerably more shallow.

The major example of the drawbacks mentioned above of prior art IGBTs arises from the fact that an IGBT has three pn-junctions in series and thereby a thyristor-like structure, which results in problems with so called latchup in its on-state. This problem as well as other drawbacks related thereto, will now be explained while referring to FIG. 1 of the appended drawings which illustrates a prior art IGBT having superimposed: a drain 1'; a highly doped p-type substrate layer 2' for forming good ohmic contact to the drain; a highly doped n-type buffer layer 3'; a low doped n-type drift layer 4'; a p-type base layer 5', which preferably is moderately doped, but may also be differently doped in different regions thereof; a highly doped n-type source region layer 6'; and a source 7'. The device also has a trench 8' carried out in the base layer 5', and the walls and the bottom of the trench are covered with an insulating layer 9' and a gate electrode 10 on top thereof.

By applying a voltage above a threshold voltage value to the gate electrode 10' a conducting inversion channel may be created at the interface between the base layer 5' and the insulating layer 9' for the conduction of electrons from the source region layer 7' to the drift layer 4' thereby turning the device on. The device may very quickly be turned off by cutting off the voltage supply to the gate electrode. This is the normal operation of the IGBT, but this function is only there in a so-called safe operating area (SOA), and outside this area the following mechanism will appear.

Since an IGBT has a highly doped substrate layer 2', the electron current (indicated by arrow 11') flowing through the inversion channel and toward the drain causes a substantial hole injection from the substrate layer 2' into the drift layer 4'. The holes move across the drift layer taking a variety of paths 12', and reach the base layer 5', and they will also move toward the source 7' for recombining with electrons from the source. Such hole paths 12' will go around the lower trench corner 13', since the holes are attracted by the negative charge of the electrons in the inversion channel thereby resulting in an electrical field concentration there, which may, when it is high enough, cause the insulating layer to burn there and the device to be destroyed. Furthermore, the paths 12' will accordingly extend laterally through the base layer below the highly doped n-type source region layer 6' and will feel the lateral spreading resistance indicated at 14' of the base layer. This in turn results in a lateral voltage drop in the base layer along the junction between the base layer 5' and the source region layer 6'. This tends to forward bias the junction, and if the voltage is large enough, substantial injection of electrons from the source region layer into the base layer will occur and the parasitic thyristor composed of the two parasitic npn and pnp transistors created this way will latch on and a latchup of the IGBT will thereby have occurred. Once the IGBT is in a latchup state, the gate no longer has any control of the drain current. The IGBT may then only be turned off in the same way as a conventional thyristor. If the latchup is not terminated quickly, the IGBT will be destroyed by excessive power dissipation. There is a critical value of drain current which will cause a large enough lateral voltage drop to activate the thyristor.

Attempts have been made to tackle these problems, and a trench-IGBT according to the introduction has been described by Constapel, Korec and Baliga in "Proceedings of 1995 International Symposium on Power Semiconductor Devices and ICs, Yokohama". It also described that IGBT has an additional, highly doped, p-type layer located at the bottom of the trench in the drift layer, next to the insulating layer separating the drift layer from the gate electrode. The holes otherwise injected into the base layer during forward conduction and going under the source region layer and thereby causing a lateral voltage drop will now instead, or in any case a larger fraction thereof, enter the highly doped additional layer and be diverted through a separate diverting circuit to the source of the device. As a result, a higher drain current may be accepted than in the prior art devices according to FIG. 1 and the safe operating area may be increased. However, it is a disadvantage of this device that a separate diverting circuit has to be applied for the holes. Furthermore, it would, of course, be desirable to extend the safe operating area of such an IGBT further.

SUMMARY OF THE INVENTION

The object of the present invention is to provide an IGBT of the type defined in the introduction, which is simply constructed and has a large safe operating area due to a high latchup tolerance.

This object is, in accordance with the invention, obtained by arranging a layer having a contact portion vertically separated from the source region layer and having the source applied thereon for collecting holes injected from the substrate layer to the drift layer at a vertical distance from the source region layer.

In this way, the source contact for the electrons and the holes are efficiently separated by utilizing the trench technology, so that the paths for the holes do not pass the source region layer any longer, so that a hole bypass construction leading to a high latchup tolerance and a large safe operating area is created.

According to a preferred embodiment of the invention the contact portion is designed to establish good electrical contact to the source, which is preferable to ensure that the collection of holes will be efficient and well restricted to the contact portion.

According to another preferred embodiment of the invention, the layer is an additional highly doped p-type layer, which constitutes a preferred way of realising a contact portion with a good electrical contact to the source.

According to another preferred embodiment of the invention, at least a part of the contact portion is located under the bottom of the trench, which has turned out to be an advantageous position from preventing the holes for passing under the source region layer.

According to another preferred embodiment of the invention, the contact portion is arranged on the top of the base layer for being separated from a space charge region located at a junction between the base layer and the drift layer. As a result, the space charge region will not reach the contact portion, and there will be no high electric field concentration there.

According to a further preferred embodiment of the invention, the trench is carried out deeply into the base layer, thereby resulting in a diversion of the hole paths at a comparatively large distance from the source region layer increasing the safe operating area.

According to another preferred embodiment of the invention, the drift layer is arranged to surround the base layer laterally with the latter separated laterally from the source region layer and the trench, and the insulating layer and the gate electrode on top thereof, are arranged on top of the base layer over the lateral extension thereof from the drift layer to the surface region layer for, upon applying of a voltage to the gate electrode, form the inversion channel with a lateral extension in the base layer. Such a lateral channel will considerably increase the channel mobility of such an IGBT, since the trap density at the interface between the base layer and the insulating layer will be much lower with this location of the surface channel, since the surface of the base layer may be formed by epitaxial growth, whereas the vertical trench wall of a device with a vertical channel has to be formed by etching or the like giving rise to a higher concentration of traps. Another important advantage of such a lateral surface channel is that the electron flow is separated from the trench, and in particular, the lower corner thereof, so that there will be no electron current attracting the holes injected in the drift layer in the region of the corner thereby avoiding any electric field concentration there. Because of the arrangement of the gate electrode far from the corner and thereby removal of the insulating layer therefrom the electric field will be much lower at the corner.

According to another preferred embodiment of the invention, the source is arranged to at least partially cover the trench. This is particularly advantageous in combination with the positioning of the gate electrode according to the previous embodiment due to the increased latchup immunity and decreasing of the electric field at the trench corner because of shifting places of the gate and the source with respect to prior art IGBTs.

According to another preferred embodiment of the invention, the transistor comprises an additional insulating layer arranged between the base layer and the source, and the additional insulating layer is located next to the contact portion and extends therefrom at least substantially to the source region layer for forcing substantially all the holes injected from the substrate layer to said drift layer to the source through the contact portion at a distance from the source region layer. Because of the arrangement of such an additional insulating layer, no holes entering the base layer may reach the source at any location between the source region layer and the contact portion, but the entire current of holes will be forced to the contact portion vertically separated from the source region layer increasing the latchup tolerance and thereby further safe operating area of the device.

According to a still further preferred embodiment of the invention, the layers, except from the insulating layers and optionally the layer having the contact portion, are made of SiC. By constructing such a device of SiC, it will be possible to maximally benefit from the advantages of an IGBT and the greatly improved latchup immunity of the IGBT according to the invention for applying such a device in high power applications. Furthermore, the trench technology is particularly well suited for producing this type of IGBT in SiC having properties excluding some other technologies useful for, for example, Si.

A further object of the invention is to provide a method for producing an insulated gate bipolar transistor, for which the drawbacks of prior art IGBTs are considerably reduced. Such a method is according to the invention, defined in the appended independent method claim.

An IGBT formed in accordance with that method will have an improved latchup immunity, an improved channel mobility and lower concentration of electrical field at the lower trench corner than prior art IGBTs, and the key to obtaining such a device is the steps of carrying out a MESA etching for forming a groove in the drift layer, epitaxially growing the base layer in the groove and creating the source region layer by using the implantation technology. This method enables the production of such an IGBT of SiC, in which the diffusitivity of dopants is remarkably reduced in comparison to especially Si.

Further advantages and preferred features of the invention will appear from the following description and the other claims.

BRIEF DESCRIPTION OF THE DRAWINGS

With reference to the appended drawings, below follows a specific description of preferred embodiments of the invention cited as examples.

In the drawings:

FIG. 1 is a schematic cross section view of an IGBT according to the prior art,

FIG. 2 is a cross section view corresponding to that of FIG. 1 of an IGBT according to a first preferred embodiment of the invention, FIGS. 3–6 are schematic cross-section views illustrating different steps of a method for producing an IGBT having the features of the IGBT according to FIG. 2.

DETAILED DESCRIPTION OF PREFERRED EMBODIMENTS OF THE INVENTION

Figure 7:
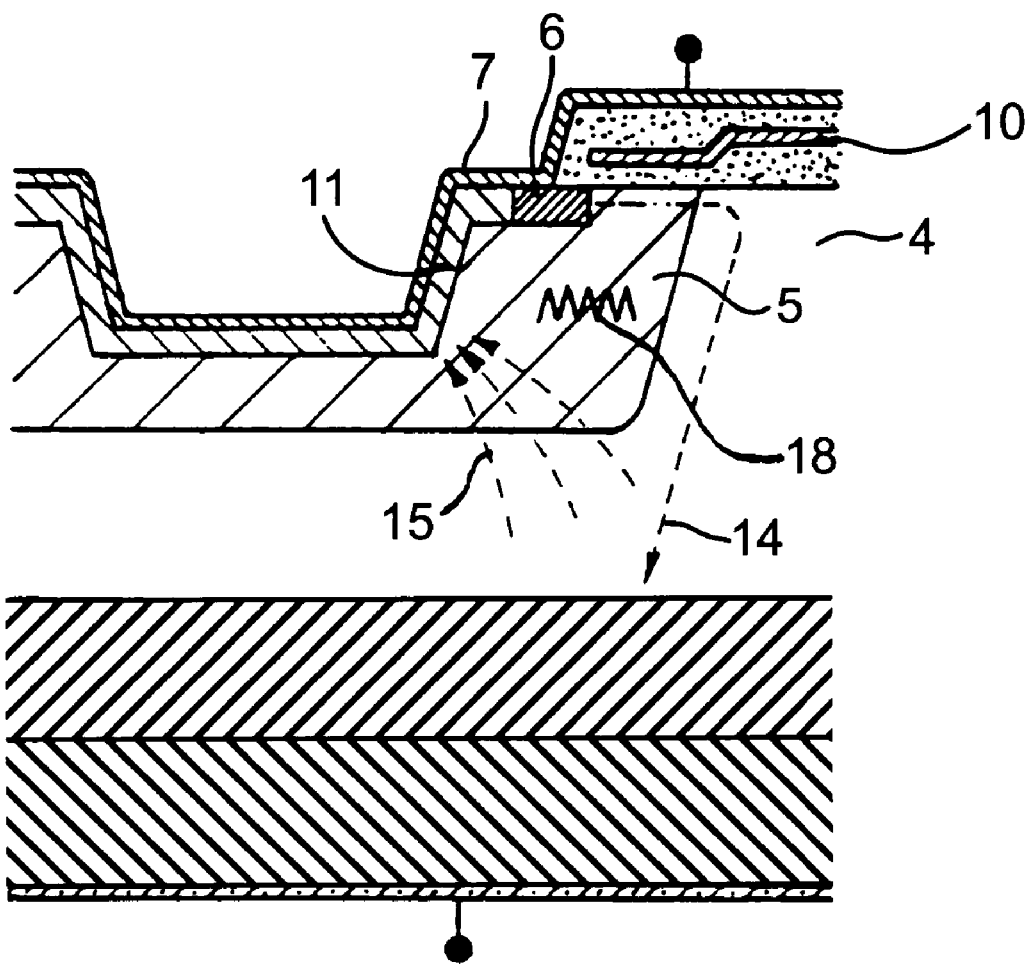
FIG. 7 is a cross-section view corresponding to that of FIG. 2 of an IGBT according to a second preferred embodiment of the invention.

FIG. 2 illustrates an insulated gate bipolar transistor (IGBT) according to a first preferred embodiment of the invention, and the parts corresponding to parts of the prior art transistor described above are provided with the same reference numerals with the index ' removed.

The transistor has superimposed a drain 1; a highly doped p-type substrate layer 2 for forming good ohmic contact to the drain; a highly doped n-type buffer layer arranged for preventing a reach-through of the depletion layer to the substrate layer; a low doped n-type drift layer 4; a p-type base layer 5, which preferably is moderately doped, but which may have a varying doping concentration or being made of two or more differently doped p-type layers; a highly doped n-type source region layer 6 and a source 7. The base layer 5 is immersed in the drift layer 4, so that it is laterally surrounded thereby, whereas the source region layer 7 is immersed in the base layer 5, so that the source region layer and the drift layer are laterally separated by the base layer. The transistor further comprises a trench 8 carried out in the base layer 5 to a considerable depth thereof, which in this case means a depth well exceeding half of the maximum depth of the base layer. An insulating layer 9 in the form of a gate oxide and a gate electrode 10 arranged thereon are arranged on the base layer and extend at least from the source region layer to the drift layer.

The transistor also comprises an additional highly doped p-type layer 11 arranged at the bottom of the trench 8 immersed in the base layer 5 and having such a thickness of the base layer 5 located thereunder, that it is separated from a space charge region created at the junction 12 between the base layer and the drift layer. The additional layer 11 forms a contact portion for establishing a good electrical contact to the source and a good hole collector at a vertical distance to the source region layer. An additional insulating layer 13 is arranged between the base layer 5 and the source 7, and it is located next to the additional layer 11 and extends therefrom to the source region layer 6. The source 7 is accordingly in direct contact with the source region layer 6 and thereby the extension down into and covering of the trench 8 with the additional highly doped p-type layer, but it is vertically separated from the base layer 5 by the additional insulating layer 13.

The transistor shown in FIG. 2 may be considered to end at the vertical symmetry line of the trench 8, and a similar transistor is formed to the left of this symmetry line in a mirror image relation to the one shown to the right. The construction of the transistor is somewhat simplified in FIG. 2, and FIG. 6 shows some more details thereof.

The function of the insulated gate bipolar transistor according to FIG. 2 will be as follows. Upon application of a voltage over a certain threshold voltage level on the gate electrode 10 a conducting inversion channel is created, at the interface between the base layer 4 and the insulating layer 9 for the transport of electrons between the source region layer 6 and the drift layer 4. This turns the transistor on if a forward bias is applied over the source and drain thereof. Thus, an electron flow indicated by the dashed arrow 14 from the source 7 to the drain 1 will result. This electron flow will cause hole injection from the substrate layer 2 into the drift layer 4, which is indicated by the dashed arrows 15. These holes will try to reach the source for recombining with the electrons thereof. The additional highly doped p-type layer 11 will function as a p-well and the holes will move to the source through this layer 11. Due to the arrangement of the additional insulating layer 13, all the current of holes will be forced to the additional layer 11 under the trench bottom since they may not reach the source through the vertical wall of the base layer 5. Accordingly, any voltage drop in the base layer will be far from the source region layer and not therealong, so that a very high drain current may be tolerated before the junction between the source region layer 6 and the base layer 4 is considerably forward biased and a greatly improved latchup immunity is obtained.

Furthermore, the separation of the inversion channel from the lower trench corner 16 also prevents any electric field concentration from occurring near the trench corner.

With reference to FIGS. 3–6 a method for producing an insulating gate bipolar transistor according to FIG. 2 will now be described. This method is particularly suited for producing such an IGBT of SiC. First, the layers 2, 3 and 4 are epitaxially grown on top of each other, and after that a MESA etch is carried out for forming a groove 17 in the drift layer 4. Then a p-type base layer 5 is epitaxially grown in the groove. Then n-type dopants are implanted into a surface layer of the base layer for forming a highly doped n-type source region layer 6 separated laterally from the drift layer 4. Of course, traditional techniques of masking and demasking are used for accomplishing the different layers, but this has been omitted from the drawings. Thereafter, the trench 8 is etched into the base layer 4, leaving the source region layer at the upper corner of the trench, although it appears from FIG. 4 as if the trench etching were was done before, but this is not the case.

Then p-type dopants are implanted into the trench in the surface region of at least the bottom thereof for forming an additional highly doped p-type layer 11. Finally, a gate oxide 9 is applied on the top of a part of the source region layer, the base layer and the drift layer, a gate electrode 10, preferably made of poly crystalline silicon, is applied and, on top thereof, an insulating oxide is applied, an additional insulating layer 13 is applied on the vertical trench wall, and a source metallization 7 is applied upon everything for forming a contact to the additional layer 11 and the source region layer 6.

Because of this way of forming a surface inversion channel, which is here lateral, this surface channel will have a high mobility as compared to the vertical channel of the prior art, since it is formed between a semiconductor layer surface epitaxially grown and an insulating layer, whereas the vertical wall of the trench created by etching is not used at all for conducting purposes.

An insulated gate bipolar transistor according to a second preferred embodiment of the invention is shown in FIG. 7. This differs from the one shown in FIG. 6 by having a trench which is not as deep as the trench in the transistor according to FIG. 2, and the additional p-type layer 11 is created by implantation of p-type dopants into the entire trench and there is no additional insulating layer arranged between the base layer 5 and the source 7, but only the additional layer 11. Accordingly, the contact portion being vertically separated from the source region layer 6 is here formed by a corresponding part 19 of the additional layer 11. This is a somewhat simplified way of constructing an IGBT according to the invention, which will result in an increased safe operating area with respect to the prior art devices shown in FIG. 1, since the paths 15 of the holes will be at a greater distance from the source region layer and the voltage drop across the base layer resistance 18 will be lower and far away from the critical junction. Because of the lateral surface channel, and the separation of the gate from the trench, there will be no electric field concentration at the lower trench corner, and the channel mobility will also be remarkably increased with respect to IGBTs having vertical inversion channels.

The invention is of course not in any way restricted to the preferred embodiments described above, but many possibilities to modifications thereof will be apparent for a man skilled in the art without departing from the basic idea of the invention.

It is emphasized that the thicknesses of the different layers in the Figures cannot be interpreted as limiting the scope of protection, but any thickness relations are intended to be covered by the claims.

Furthermore, the buffer layer does not have to be there, but is used when lower on-state losses are desired. Furthermore, the definition of "superimposed" in the claims is to be interpreted broadly and means that there is a contact in the vertical direction between such subsequent layers, so that for instance the additional layer in FIG. 2 may be defined as superimposed on the base layer, although the base layer has a vertical extension upwardly beyond the additional layer.

The dopants used may be of any material suitable as dopants for this application.

The claim definition that the source region layer is provided with a lateral extension from an upper corner of the trench does not exclude that it also has portions extending in other directions, such as down into the trench.

The independent patent claim concerning the method for producing an insulated gate bipolar transistor does of course not include every step necessary for producing such a transistor, but several conventional steps of semiconductor technologies will also be used.

The claim definition that the source region layer is provided with a lateral extension from an upper corner of said trench does not preclude that it also has portions extending in other directions, such as down into the trench.

"Substrate layer" is in this disclosure to be interpreted as the layer closest to the drain of the layers mentioned and is not limited to a substrate layer in the strict sense of this word within this field, i.e. the layer from which the growth is started. The real substrate layer may be any of the layers and is mostly the thickest one, such as the drift layer.

The method claims are to be interpreted as not restricted to a growth of the layers located on top of each other in the order they are mentioned, but any other order of growth of these layers is within the scope of the claims. For instance, the method may be started from the drift layer and the so called substrate layer and the drain may be grown at the very end of the method.

The claim definition "contact portion" is to be interpreted very broadly and this contact portion may be constituted by the base layer itself, but it is preferred that it is designed to establish a good electrical contact to the source. It is a disadvantage to obtain this by simply giving the base layer a high doping concentration, since this makes it much more difficult to deplete it for forming the inversion channel. A possibility to form the contact portion is to apply a contact metal at the location in question. Another possibility is to implant for example Ge into a surface layer in, or close to, the bottom of the trench for creating a good electrical contact there. However, it is emphasized that such a good electrical contact is not a requirement for the proper function of the transistor according to the invention, but it will further improve the characteristics thereof. The important thing is that a contact to the source for collecting holes is established at a vertical distance from the source region layer.

We claim:

1. An insulated gate bipolar transistor (IGBT) comprising superimposed a drain, a highly doped p-type substrate layer, a low doped n-type drift layer, a p-type base layer, a highly doped n-type source region layer and a source electrode, a trench etched into said base layer, an insulating layer with a gate electrode thereon, said insulating layer arranged on the base layer at least from the source region layer to the drift layer for, upon applying a voltage to the gate electrode, forming a conducting inversion channel in the base layer at the interface with the insulating layer for the electron transportation from the source electrode to the drain, an additional layer having a contact portion vertical separated from the source region layer and having the source electrode applied thereon for collecting holes injected from the substrate layer to the drift layer at a vertical distance from the source region layer and an additional insulating layer arranged between said base layer and said source, said additional insulating layer being located next to said contact portion and extending therefrom at least substantially to said source region layer for forcing substantially all said holes injected from said substrate layer to said drift layer to the source electrode through said contact portion at a distance from said source region layer.

2. A transistor according to claim 1, wherein said contact portion is designed to establish a good electrical contact to the source electrode.

3. A transistor according to claim 2, wherein said additional layer is a highly doped p-type layer.

4. A transistor according to claim 2, wherein said contact portion is made of metal forming a good electrical contact to the source electrode.

5. A transistor according to claim 1, wherein at least a part of said contact portion is located under a bottom of said trench.

6. A transistor according to claim 5, wherein substantially the entire contact portion is located under said trench bottom.

7. A transistor according to claim 1, wherein said contact portion is arranged on said base layer in said trench and to be separated from a space charge region created at a junction between said base layer and said drift layer.

8. A transistor according to claim 1, wherein said trench is carried out deeply into said base layer.

9. A transistor according to claim 8, wherein said trench is carried out into said base layer to a depth exceeding one half of the maximum depth of the base layer.

10. A transistor according to claim 1, wherein said drift layer surrounds said base layer laterally with the base layer separating said drift layer laterally from the source region layer and the trench, and said insulating layer and the gate electrode on top thereof are arranged on top of said base layer over the lateral extension thereof from the drift layer to the source region layer for, upon applying of a voltage to said gate electrode, forming said inversion channel with a lateral extension in said base layer.

11. A transistor according to claim 1, wherein said source electrode at least partially covers said trench.

12. A transistor according to claim 11, wherein said source electrode covers at least a part of the bottom of said trench.

13. A transistor according to claim 1, wherein that said source region layer is provided with a lateral extension from an upper corner of said trench.

14. A transistor according to claim 1, wherein said layers, except for said insulating layers and optionally said additional layer having said contact portion, are made of SiC.

15. A transistor according to claim 1 further comprising a highly doped n-type buffer layer between said highly doped p-type substrate layer and said low doped n-type drift layer.

* * * * *